United States Patent
Rivera et al.

(10) Patent No.: US 9,929,026 B2
(45) Date of Patent: Mar. 27, 2018

(54) METHODS AND APPARATUSES FOR DEUTERIUM RECOVERY

(71) Applicant: Poongsan Corporation, Seoul (KR)

(72) Inventors: Manuel Rivera, San Jose, CA (US); Biao Wu, Cupertino, CA (US)

(73) Assignee: HPSP CO., LTD., Hwasung-si, Gyeonggi-Do (KR)

( * ) Notice: Subject to any disclaimer, the term of this patent is extended or adjusted under 35 U.S.C. 154(b) by 303 days.

(21) Appl. No.: 14/961,859

(22) Filed: Dec. 7, 2015

(65) Prior Publication Data

US 2016/0086831 A1 Mar. 24, 2016

Related U.S. Application Data

(62) Division of application No. 14/448,745, filed on Jul. 31, 2014, now Pat. No. 9,257,314.

(51) Int. Cl.
*H01L 21/67* (2006.01)
*B01D 46/00* (2006.01)
(Continued)

(52) U.S. Cl.
CPC .... *H01L 21/67103* (2013.01); *B01D 46/0027* (2013.01); *B01D 46/0036* (2013.01); *B01D 53/002* (2013.01); *B01D 53/02* (2013.01); *B01D 53/32* (2013.01); *C01B 4/00* (2013.01); *C23C 16/4412* (2013.01); *H01L 21/67017* (2013.01); *H01L 21/67098* (2013.01); *H01L 21/67109* (2013.01); *H05B 1/0202* (2013.01);
(Continued)

(58) Field of Classification Search
None
See application file for complete search history.

(56) References Cited

U.S. PATENT DOCUMENTS 6,737,361 B2   5/2004   Yoo
6,833,306 B2   12/2004  Lyding et al.
(Continued)

FOREIGN PATENT DOCUMENTS

WO   WO 2007/091784 A1   8/2007
WO   WO-2016018593 A1 *  2/2016   ....... H01L 21/67098

OTHER PUBLICATIONS

A Durable Gas Purification Technology for High-flow Hydrogen in LED, Power Device and Photovoltaic Fabrication, Power + Energy Inc., Ivyland, PA, 9 pages, circa prior to Jul. 30, 2014.
(Continued)

*Primary Examiner* — Jeffrie R Lund
(74) *Attorney, Agent, or Firm* — Womble Bond Dickinson (US) LLP

(57) ABSTRACT

Novel methods, systems, and apparatuses for reclaiming annealing gases from a high pressure annealing processing system are disclosed. According to an embodiment, the exhaust gasses from the high pressure annealing processing system are directed into a gas reclaiming system only when a precious gas, e.g., deuterium is used. The annealing gas is the separated from other gasses used in the high pressure annealing processing system and is then pressurized, filtered, and purified prior to transferring the gas to a bulk storage distribution unit. In one embodiment, the reclaimed gas is then again provided to the high pressure annealing processing system to anneal the wafers.

7 Claims, 7 Drawing Sheets

(51) Int. Cl.
*H05B 1/02* (2006.01)
*B01D 53/00* (2006.01)
*B01D 53/32* (2006.01)
*C01B 4/00* (2006.01)
*C23C 16/44* (2006.01)
*B01D 53/02* (2006.01)

(52) U.S. Cl.
CPC ...... *H05B 1/0233* (2013.01); *B01D 2253/116* (2013.01); *C23C 16/4402* (2013.01); *C23C 16/4408* (2013.01)

(56) References Cited

U.S. PATENT DOCUMENTS

| | | | |
|---|---|---|---|
| 6,913,961 | B2 | 7/2005 | Hwang |
| 8,481,123 | B2 | 7/2013 | Kim et al. |
| 8,936,834 | B2 * | 1/2015 | Kim ............ H01L 21/324 427/372.2 |
| 9,257,314 | B1 * | 2/2016 | Rivera ......... H01L 21/67098 |
| 2002/0129901 | A1 * | 9/2002 | Fujikawa ........ C30L 333/005 156/345.31 |
| 2002/0146506 | A1 * | 10/2002 | Yoo .............. B01D 53/96 427/150 |
| 2004/0187683 | A1 * | 9/2004 | Wang ............ B01D 53/02 95/114 |
| 2004/0266117 | A1 | 12/2004 | Hwang |
| 2007/0187386 | A1 | 8/2007 | Kim et al. |
| 2008/0138917 | A1 | 6/2008 | Verhaverbeke et al. |
| 2008/0166890 | A1 | 7/2008 | Hwang |
| 2009/0148965 | A1 | 6/2009 | Kim |
| 2011/0174775 | A1 | 7/2011 | Umeoka et al. |
| 2013/0302916 | A1 | 11/2013 | Kim et al. |
| 2015/0376801 | A1 * | 12/2015 | Bairamijamal ...... B01D 53/002 204/257 |
| 2016/0035600 | A1 * | 2/2016 | Rivera ......... H01L 21/67098 95/8 |
| 2016/0086831 | A1 * | 3/2016 | Rivera ......... H01L 21/67098 219/391 |

OTHER PUBLICATIONS

Advanced Palladium Membrane Scale-up for Hydrogen Separation, The Energy lab, Jun. 2011, 2 pages, FE0004967, National Energy Technology Laboratory (NETL) , circa prior to Jul. 30, 2014.
Howard, B. H. et al,, Hydrogen permeance of palladium-copper alloy membranes over a wide range of temperatures and pressures, Journal of Membrane Science 24, Apr. 2004, pp. 207-218.
Eisman, Glenn, Recycling Hydrogen with a Novel Electrochemical Process, IndustrialHeating.com, pp. 45-47, Oct. 2012, H2Pump LLC, Latham, NY.
$H_2$ Recycling System, Less Hydrogen expense. More operating sense., 2 pages, $H_2$ Pump, Latham, NY, H2PumpLLC.com, circa prior to Jul. 30, 2014.
Staudt, Rhonda, Hydrogen Recycling System Evaluation and Data Collection, May 16, 2013, pp. 1-18, TV018, H2Pump LLC, Latham, NY, circa prior to Jul. 30, 2014.
Molburg, John C. et al., Hydrogen from Steam-Methane Reforming with $CO_2$ Capture, Jun. 30, 2003, $20^{th}$ Annual International Pittsburgh Coal Conference, Pittsburg, PA, 21 pages.
Mehra, Yuv, et al., Hydrogen Purification in Hydroprocessing, Bock 2, Forum 8 paper, World Petroleum Congress, 11 pages, circa prior to Jul. 30, 2014.
Pagano, M., Hydrogen Management Console, ERTC—Sep. 2011, Hydrogen Network Design Tool (HyN•DT™), Technip, Nov. 2009, pp. 1-26.
Pneumatic and Hydraulic Driven Gas Boosters, Haskel Milton Roy, GB Aug. 2011, pp. 1-36, circa prior to Jul. 30, 2014.
ECN Energy research Centre of the Netherlands, Hydrogen Separation Modules (HYSEP®), pp. b-09-010hysep, http://www.ecn.nl/en/eei/rd-prooramme/process-intensification/, circa prior to Jul. 30, 2014.
Module Type 308, ECN Energy research Centre of the Netherlands, Hydrogen Separation Modules (HYSEP®), 2 pages, b-09-010 (308, circa prior to Jul. 30, 2014).
Module Type 1308, ECN Energy research Centre of the Netherlands, Hydrogen Separation Modules (HYSEP®), 2 pages, b-09-010 (1308) , circa prior to Jul. 30, 2014.
Breaking the Fuel Cell Cost Barrier, CellEra, Inc., 1 pages, circa prior to Jul. 30, 2014.
Hydrogen Separation Membranes, Technical Brief, May 2010, NCHT, EERC MH36028.INDD, University of North Dakota, Grand Forks, 4 pages, circa prior to Jul. 30, 2014.
Pach, John et al., Purge gas recovery, An attractive scheme for methanol-ammonia co-production, Johnson Matthey Process Technologies, $16^{th}$ IMPCA 2013 Asian Methanol Conference, 13 pages, circa prior to Jul. 30, 2014.
Advanced Prism® Membrane Systems for Cost Effective Gas Separations, Prism Separators®, © Air Products and Chemicals, Inc.—1999—SQN—03.99—5000 UK—MC 1987, 14 pages.
PS4-MT50-H Specifications, PS4-MT Series Hydrogen Gas Purifier, 150 slpm, saes® getters, Nov. 1, 2001, S110-222, Rev D, DCN 2089, pp. 1-4, circa prior to Jul. 30, 2014.
PS4-MT50-N Specifications, PS4-MT Series Nitrogen Gas Purifier, 100 slpm, saes® getters, Nov. 1, 2001, S110-239, Rev B, DCN 2090, pp. 1-4, circa prior to Jul. 30, 2014.
Ilias, Shamsuddin et al., Separation of Hydrogen Using Electroless Deposited Thin-Film Palladium-Ceramic Composite Membrane, Department of Chemical Engineering, North Carolina A&T State University, Greensboro, NC, 8 pages, circa prior to Jul. 30, 2014.
Ciocco, M.V. et al., High-Pressure, High-Temperature Hydrogen Permeability Measurements of Supported Thin-Film Palladium Membranes, 11 pages, circa prior to Jul. 30, 2014.
PCT International Search Report and Written Opinion for International Application No. PCT/US2015/040055, dated Oct. 14, 2015 (14 pages).

* cited by examiner

METHODS AND APPARATUSES FOR DEUTERIUM RECOVERY

This application is a divisional of co-pending U.S. patent application Ser. No. 14/448,745 filed on Jul. 31, 2014.

BACKGROUND OF THE INVENTION

Field of the Invention

The present invention generally relates to semiconductor manufacturing process. More particularly, the present invention pertains to methods and apparatuses which use precious gases, like deuterium, during a high pressure annealing process of semiconductor manufacturing.

Description of the Related Art

During the semiconductor manufacturing process, various different thermal treatments are performed on a semiconductor wafer, for example, during or following oxidation, nitridation, silicidation, ion implantation, and chemical vapor deposition processes, to create the integrated circuits on the semiconductor wafer.

Key determining factors for effective fabrication of integrated circuits not only include the process temperature, but also the processing time and the concentration of a particular gas or a mixture of gases used for a particular application or treatment. These three factors are generally considered as independent variables which determine the efficiency of the processing. For example, by increasing the process temperature while keeping the gas concentration constant, the process efficiency will improve. Similarly, by increasing the gas concentration at the same temperature, the process efficiency can be improved. It should be noted that exposure of semiconductor wafers, or more precisely integrated circuits, to excessive heat generally degrades the quality of the integrated circuits, in an irreversible and cumulative way. This is, in part, due to the diffusion of various carriers and ions implanted on the wafer, whose rate increases, typically superlinearly, with temperature. Each integrated circuit has an acceptable limit of total thermal exposure during the whole manufacturing process, which is referred to as the circuit's thermal budget in the related art.

As the technology and device structure approaches the nanometer scale, the limited thermal budget requirement demands higher concentration of the processing gas. Annealing wafers in a forming gas containing diatomic hydrogen, typically following fabrication but before encapsulation or other packaging steps, has been widely used for repairing various process induced damages during the semiconductor fabrication process as well as for sintering process, which is referred to as hydrogen passivation in the art. The annealing or forming gas generally incorporates approximately 2% to 10% hydrogen ($H_2$) with the remainder being inert gas such as nitrogen ($N_2$).

Recently, however, many researchers have reported that pure (100%) deuterium anneal improves the device characteristics and performance such as hot carrier reliability, transistor lifetime, and reduction of dangling bonds and unwanted charge carriers. Improvement of device lifetime increases the transconductance (speed performance) of the device. As the device technology and structure move to the sophistication of the so-called "nanometer technology", new high pressure application technologies require use of other gases such as fluorine ($F_2$), ammonia ($NH_3$), and chlorine ($Cl_2$), which can be highly reactive or toxic. The forming gas (partial pressure) anneal and/or pure $H_2$ or $D_2$ anneal has been generally done at a temperature range above 450° C., and higher temperature tends to result in better performance. However, as the device scale reaches 28 nm or below, the limited thermal budget after first metallization requires annealing temperatures at or below 400° C., thus potentially diminishing the hydrogen annealing benefit on semiconductor device performance.

As an alternative, hydrogen or deuterium high pressure annealing can result in excellent performance and improvement. Particularly, hydrogen and/or deuterium annealing of high-K gate dielectric device showed significant performance improvement in charge reduction, dangling bond reduction, and increase of transconductance. This finding has been disclosed, for example, in the U.S. Pat. No. 6,913,961 and U.S. Pat. No. 6,833,306. This improvement is very significant for the manufacturing process of integrated circuit devices using high-K gate dielectric for the next several generations of semiconductor device technology.

High pressure annealing, in particular, in the hydrogen ($H_2$) or deuterium ($D_2$) environment can improve performance of semiconductor devices. This finding has been disclosed, for example, in the U.S. Pat. No. 8,481,123. In that patent, titled: Method For High Pressure Gas Annealing, various embodiments are disclosed to anneal a silicon substrate wafer in a high pressure environment. As disclosed in that patent, in a high pressure annealing process, high pressure hydrogen or deuterium gas is used in various annealing processes, such as high-K gate dielectric process anneal, post-metallization sintering anneal, and forming gas anneal. The use of high pressure gas can significantly improve the device performance. For example, it could increase the device's lifetime and its transconductance, and it can decrease the number of dangling bonds. One of the main advantages of the high pressure gas annealing is that these improvements in the device performance can be achieved with a reduced thermal budget cost at a given temperature and/or a given processing time, which is an essential requirement for the advanced device technology.

It is known that one of the main advantages of the high pressure technology is the increase of the reaction rate by effectively increasing the gas concentration at high pressure. By increasing the pressure of the processing gas, the density of the processing gas will increase. The gas density increases roughly linearly as the pressure increases. For example, if pure 100% hydrogen or deuterium is processed in 5 atm high pressure condition, the actual amount of hydrogen or deuterium gas that semiconductor silicon is exposed to is 5 times the concentration of the original (100%) hydrogen or deuterium gas at the atmospheric pressure. In the case of partial pressure conditions, if the hydrogen or deuterium concentration is 20% and the silicon wafer is processed at 5 atm pressure, then the silicon wafer is effectively exposed to the equivalent of 100% hydrogen or deuterium at atmospheric pressure. Likewise, processing with 20% hydrogen or deuterium gas at 20 atm will be roughly equivalent to 4 times of the processing result with the pure (100%) hydrogen or deuterium gas at 1 atm.

By increasing the pressure of the process gas, it is possible to reduce both the processing temperature and the process time. As the thermal budget limitation reaches the "extreme limit level," and as the device technology reaches the 28 nm range, high pressure processing becomes a viable solution which meets or exceeds many thermal processing requirements in the semiconductor fabrication technology. The high pressure processing can provide the following benefits with respect to the three aforementioned process parameters; process time reduction, process temperature reduction, and process gas concentration reduction. (1) By increasing pressure, the process temperature can be reduced while maintaining the gas concentration and process time unchanged in order to obtain equivalent or similar process results. (2) By increasing pressure, the process time can be reduced significantly while keeping other parameters of temperature and gas concentration unchanged in order to obtain equivalent or similar process results. (3) By increasing pressure, the process gas concentration can be reduced while maintaining the time and temperature parameters unchanged in order to obtain equivalent or similar process results.

Application of high pressure hydrogen/deuterium process anneal to high-K gate dielectric process anneal, post-metallization sintering anneal, and forming gas anneal in the semiconductor fabrication could achieve a significant improvement in the device performance, for example in terms of increased device lifetime, enhanced transconductance, and reduced number of dangling bonds, and also achieve significant process thermal budget improvement at a given processing temperature and processing time, which is an essential requirement for the advanced device technology.

As described in U.S. Pat. No. 8,481,123, the gas from the outer chamber is released at the same time and mixed with the hydrogen/deuterium gas or other toxic or flammable gas from the inner chamber. Another inert gas such as nitrogen is added during the venting process thereby further reducing the concentration of the reactive gas exhausted to the atmosphere from the annealing vessel. After the process is completed and the gases used for various purposes are depressurized, any remaining residual gas trapped in the annealing chamber are safely removed by purging extra nitrogen flow near, or around, the exhaust valves or pipes of the annealing vessel before discharging the remaining gases into the atmosphere. This is done to avoid direct exposure of concentrated hydrogen or deuterium with the atmosphere, to prevent a potentially dangerous condition.

The high pressure annealing processing unit, as described in U.S. Pat. No. 8,481,123, comprises a vertical high pressure processing system, as illustrated in FIG. 1. According to that invention, the annealing vessel has a dual chamber structure, comprising an inner chamber and an outer chamber, and a reactive gas, which may be flammable, toxic, or otherwise dangerous, is confined in the inner chamber. The inner chamber is then protected by the external pressure exerted by another gas contained in the outer chamber. This design provides a buffer zone in case where there is a leakage of the processing gas from the inner processing chamber, and hence it provides, among other things, two main benefits: It dilutes the potentially dangerous gas leaked from the inner chamber, and it prevents the leaked gas from directly releasing into the air. In certain embodiments, more than one outer chambers are used to provide multiple layers, or buffer zones, of protection. The main external vessel, or the outer chamber, shown in the figure comprises three components, top 37, body 39, and bottom 38. In some embodiments, these external vessel components are made of type 316 stainless steel material that has high stress point to pressure. The vessel top 37 is normally attached to the main vessel body 39 by screws, and the vessel bottom 38 is attached to the main vessel 39 using a breech door locking 40, which is also made of type 316 stainless steel in some embodiments. In this exemplary design, the vessel bottom is separated from the main vessel when the vessel door opens for loading and unloading.

Inside the main vessel, there is a 4-zone main heater 34 that controls each heater zone independently. The heater elements 34 are insulated from the vessel wall by an insulator 33. There is also a 2-zone plug heater 24 on top of the bottom component of the vessel 38 in this embodiment, which can heat the wafer holder or wafer boat 22 from the bottom. The wafer boat holds one or more semiconductor wafers 23, and in some embodiments, it is made of quartz. The external main vessel has cooling water lines 31 to prevent the vessel from overheating by the heater 34 inside the vessel beyond the safety temperature. Around the plug heater 24, quartz cap 27 is placed, and it has quartz helix around the plug heater that will heat the incoming process gas to the process temperature. The process gas is introduced into the inner processing chamber, or tube, 21 via a gas injector 26, which pressurizes the tube. The inner process chamber is made of non-metallic materials such as quartz and the outer chamber is made of metals or metallic alloys such as stainless steel.

In other embodiments, both chambers are made of metallic materials with high melting points. The inner chamber 21 divides the space in the vessel into two regions, and the gases in these two regions can be completely isolated and they can have different pressures. The gas pressure inside the process chamber, indicated as 20 in the figure, is called a tube pressure and the pressure outside the inner chamber, indicated as 30 in the figure, is called a shell pressure. The outer shell chamber is pressurized by gas typically different from the processing gas, which may be highly reactive, flammable, or otherwise dangerous. In some embodiments inert gas such as nitrogen is used for this purpose. Nitrogen is introduced into the outer chamber via a shell nitrogen injector 50 in the exemplary embodiment shown in the figure. The figure also shows two chill plates, top 32 and bottom 28, which are used to protect components in the temperature protected areas above the top chill plate 32 and below the bottom chill plate 28 from excessive heat. The shell pressure area inside the outer chamber and the tube pressure area inside the processing chamber are separated and sealed by O-rings 25. O-rings 36 are also used to hold the shell pressure by preventing the inert shell gas from leaking from the main vessel to the outside atmosphere.

Equalizing, or near-equalizing, pressures of the shell nitrogen 30 and the tube hydrogen 20 will maintain the integrity of the quartz tube from collapsing, either inward or outward. When the tube is fully pressurized by hydrogen/deuterium or other processing gas to the designated pressure level, the shell is also pressurized by nitrogen or other inert gas to the same or comparable pressure level.

When the high pressure processing is completed, the tube pressure 20 will be released via de-pressurizing exhaust 29, and the shell pressure 30 will be released via shell pressure exhaust 35, which are controlled by a pressure control valve 41. Both the shell pressure and the tube pressure is controlled by the same pressure control valve or a set of valves. When the pressure control valve 41 releases the pressure, the nitrogen in the shell and hydrogen or other process gas in the tube are simultaneously released to the exhaust. The exhaust gases are mixed, and this effectively dilutes the processing gas such as hydrogen with nitrogen and also maintains the pressure differential between the two chambers within a desired range. In the exemplary embodiment shown in the figure, where the volume of the outer chamber is three times that of the inner chamber, the concentration of the processing gas from the inner chamber becomes diluted to the one-third level of its original concentration. For example, when a forming gas with 30% hydrogen has been used during the annealing, the hydrogen concentration in the exhaust will be around 10%. The pressure of the gases is maintained with the help of a computing device associated with the high pressure processing unit. Examples of a computing device can be a programmable logic, control, and ASIC control, or any computing device that can be integrated and/or associated with such a system, as known to one of ordinary skill in the art. Further, it will be appreciated that pressure sensors within both the inner and outer chambers may be coupled to a computer which provides the control described herein, and this control may be implemented through a software program executing on the computer.

When the pressure control valve 41 opens, the pressures of both chambers are simultaneously released while the gases of nitrogen and hydrogen are still under high pressure. Hydrogen, though diluted by nitrogen from the shell, should not be exposed to the atmosphere. Any defects in the exhaust pipe, typically made of stainless steel, will release hydrogen into the atmosphere. In order to prevent such unwanted leak from defects in the stainless steel pipe, the exhaust line stainless steel pipe, 42 in FIG. 1, is made of double-walled stainless steel in some embodiments of the present invention. In the double-walled stainless steel construction, if the first or inner gas pipe experiences a defect and the gas leaks, the second or external protective pipe will contain any leaked hydrogen in the pipe. Thus the likelihood of the gas leak directly into the atmosphere is significantly reduced. The hydrogen, diluted by the shell nitrogen, flows to the dilution tank 43 via the double-walled exhaust line 42 to be further diluted prior to moving to the hydrogen/deuterium burning scrubber 45 via another double-walled stainless steel line 44. After the scrubber burns the hydrogen and any flammable gas in the exhaust, it will release the burnt residue into the atmosphere, indicated by the arrow 53 in the figure. The exhaust vent line will most likely have water condensation inside the line, particularly if the scrubber is not used, due to the back streaming air from the atmosphere, which typically has much lower temperature than the exhaust gas. The condensation may react with hydrogen since water ($H_2O$) contains oxygen. This could be a source of safety problem. In order to prevent the water condensation and also to increase dilution of venting hydrogen/deuterium, additional nitrogen is injected in the exhaust vent line in some embodiments. FIG. 1 shows a nitrogen injection line 56, which is connected to the exhaust vent line immediately after the exhaust vent valve, and this injection line 56 serves as a constant source of nitrogen to guarantee a constant overflow of a gas from the outlet of the scrubber 45. According to at least one embodiment, low flow of nitrogen is maintained during the normal operation in order to prevent any condensation in the vent line and to maintain an always outward flow of nitrogen from the scrubber 45. During the chamber depressurization, the nitrogen flow may be increased in order to further dilute the venting hydrogen/deuterium or any other potentially dangerous processing gas exhausted from the annealing vessel.

FIG. 1 shows a source of high pressure hydrogen or deuterium as the incoming processing gas via canister 49. The incoming processing gas flows into the gas control panel or cabinet 46 through gas lines 54 and 48, and it is injected into the processing chamber 21 through gas pipe 51 and through the gas injector 26 (the gas line between the pipe 51 and the injector 26 is not explicitly shown in the figure). The incoming hydrogen or deuterium gas may be 100% pure, and the pressure is typically 500 PSI at minimum, and hence the incoming gas lines, for example, 54, 48, and 51, and various parts around the gas canister or pump can be one of the most dangerous areas in the high pressure system. The system also includes a $H_2/D_2$ gas panel, where all the gas control components (not shown in the figure) are installed. An $H_2/D_2$ detector sensor is installed inside the control panel. Thus, the presence of the hydrogen or deuterium sensor enables the system to distinguish between the gasses used to anneal the substrate wafer. The high pressure annealing processing system is not limited to any particular processing gases, and any type of gas may be used based on application requirements.

However, when a precious gas (e.g., deuterium) is used as the annealing gas, the high pressure annealing processing unit would safely discard the annealing gas from the exhaust. Thus, the precious gas is discarded and is not reused. No system exists that could safely extract the used precious annealing gas (e.g., deuterium) from the exhaust of the annealing process for reuse.

BRIEF SUMMARY OF THE DESCRIPTION

Systems, apparatuses, and computer readable medium to reclaim at least a first annealing gas from an exhaust gas line of a high pressure annealing process system used to anneal a plurality of substrates in a semiconductor manufacturing process are disclosed. In one embodiment, a gas reclaiming system, after receiving a signal about the presence of at least the first annealing gas in a high pressure annealing processing (HPAP) system, purges the gas reclaiming system with a second gas. There after, the annealing gas mixture can be redirected from the exhaust system using a siphon system, a vacuum pump system, or other pump systems, wherein the at least first annealing gas and the second gas are mixed together to form a mixture of a plurality of gases in the gas reclaiming system. After the redirecting, the plurality of gases can be conveyed to a gas separating unit of the gas reclaiming system, wherein the gas separating unit separates the at least first annealing gas from the plurality of gasses, and wherein the gas separating unit can dispose of the reminder of the plurality of gasses.

The at least first annealing gas is conveyed to a heat exchange unit of the gas reclaiming system to cool the at least first annealing gas after it leaves the gas separating unit, and then the at least first annealing gas can be directed to a gas monitoring system to monitor the quality of the at least first annealing gas. If the concentration of the at least first annealing gas in the separated gas is not above a predetermined threshold, then the at least first annealing gas is re-directed to the gas separating unit to separate the at least first annealing gas from the plurality of gases. Thereafter, the at least first annealing gas is conveyed to a gas pressurizing unit of the gas reclaiming system, wherein the at least first annealing gas is pressurized above atmospheric pressure to yield a pressurized first annealing gas. In one embodiment, the gas reclaiming system then diverts the first pressurized annealing gas to a filter and/or purification system, reclaiming the purified and pressurized first annealing gas, after which it is stored for distribution to the high pressure annealing processing system. In one embodiment, the gas mixture from the annealing gas is directly received from the high pressure annealing process apparatus prior to mixing the annealing gas with non-annealing gasses in the exhaust system of the high pressure annealing process apparatus.

In another one embodiment, the quality of the separated annealing gas is tested at least by determining the concentration of the at least first annealing gas in the separated annealing gas. In yet another embodiment, on conveying the separated annealing gas back to the gas separating unit comprises passing the separated annealing gas though the heat exchange unit again. In one embodiment, the at least first annealing gas is deuterium. In another embodiment, the second gas is an inert gas (e.g., nitrogen), which is the same gas used in the outer chamber of the HPAP system. In yet another embodiment, the gas separation unit heats the gas to a predetermined temperature in order to extract the at least first annealing gas efficiently. In one embodiment, the signal about the presence of at least the at least first annealing gas in the exhaust of the high pressure annealing processing unit is transmitted by an automated process control device. In yet another embodiment, the automated process control device transmits the signal only upon a determining that the concentration of the at least first annealing gas is higher than a predetermined threshold.

In another embodiment, the signal is transmitted from a data processing system which controls the HPAP system, and is received by another data processing system that controls the gas reclaiming system. In another embodiment, the signal transmitted from the HPAP is derived from a recipe programmed and/or stored in a data processing system. In this embodiment, when another recipe is used by the HPAP system, the data processing system determines that a predetermined amount of the annealing is not used. In such a case, the HPAP system would not provide the signal to the gas reclaiming system to reclaim the gas, and the annealing gas would be safely discarded.

In yet another embodiment, the second gas is the same gas which is used as the outer buffer of an HPAP system, the outer buffer surrounding the at least first annealing gas in an annealing chamber of the HPAP system. In another embodiment, the purified and pressurized first annealing gas is stored in a first bank of one or more vessels, while a second bank of one or more vessels is coupled to the HPAP system to provide the at least first annealing gas for an annealing process while reclaimed first annealing gas is stored in the first bank. In yet another embodiment, the second bank is switchable with the first bank.

In one embodiment, a semiconductor wafer processing system is disclosed, the system comprising an HPAP system having an inner chamber configured to hold wafers and either an annealing gas or another gas in the inner chamber, and having an outer chamber which surrounds the inner chamber and which is configured to hold an inert gas while the inner chamber holds either the annealing gas or the another gas. The system includes a gas reclaiming system and a valve switchably coupling the inner chamber to either an atmospheric exhaust or to the gas reclaiming system. The system also includes a data processing system coupled to the valve to control the valve to switch the valve between atmospheric exhausting when the another gas was used in the inner chamber and gas reclaiming when the annealing gas was used in the inner chamber. In one embodiment the gas reclaiming system also includes, a low pressure gas capture system to retrieve the annealing gas from the inner chamber, the low pressure gas capturing system switchably coupled to the inner chamber though the valve. The gas reclaiming system can further include a gas separation unit coupled to the low pressure gas capture system, the gas separation unit configured to separate the annealing gas from a purge gas, and a purge gas pump coupled to the gas separation unit and configured to pump the purge gas into the gas separation unit. The gas reclaiming system also includes a heat exchanger coupled to the gas separation unit, the heat exchanger configured to cool the annealing gas that is output from the gas separation unit, and a gas purifier coupled to the heat exchanger, the gas purifier including one or more filters. Further the gas reclaiming system, in one embodiment, includes a bank of one or more storage vessels coupled to the gas purifier to store purified annealing gas.

In another embodiment, a semiconductor wafer processing system is described. The system comprises, a high pressure annealing system having an inner chamber configured to hold wafers and either an annealing gas or another gas in the inner chamber, and having an outer chamber which surrounds the inner chamber and which is configured to hold an inert gas while the inner chamber holds either the annealing gas or the another gas. The system further comprises a gas reclaiming system, a valve switchably coupling the inner chamber to either an atmospheric exhaust or to the gas reclaiming system, and a data processing system coupled to the valve to control the valve to switch the valve between atmospheric exhausting when the another gas was used in the inner chamber and gas reclaiming when the annealing gas was used in the inner chamber. In one embodiment, the gas reclaiming system can further comprise a gas capture system to retrieve the annealing gas from the inner chamber, where the gas capturing system is switchably coupled to the inner chamber though the valve, a gas separation unit coupled to the gas capture system, the gas separation unit configured to separate the annealing gas from a purge gas, a purge gas source coupled to the gas separation unit and configured to supply the purge gas into the gas separation unit, a gas purifier coupled to an optional heat exchanger, the gas purifier including one or more filters, and a bank of one or more storage vessels coupled to the gas purifier to store purified annealing gas. In one embodiment, the gas capture system is a low pressure gas capture system, while in another embodiment the gas capture system includes a pump that pumps a flushing gas into the inner chamber of a HPAP system, to flush the annealing gas out of the inner chamber and into the gas reclaiming system. In one embodiment, the purge gas source of the gas reclaiming system comprises a gas pump. In yet another embodiment, the gas reclaiming system comprises a heat exchanger coupled to the gas separation unit, the heat exchanger configured to cool the annealing gas that is output from the gas separation unit. In one embodiment, the gas separation unit separates the annealing gas using a molecular sieve system (e.g. permeable membrane). In another embodiment, the gas separation unit separates the annealing gas using a cryogenic process system. In yet another embodiment, the gas separation unit separates the annealing gas using an electrolysis process system.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
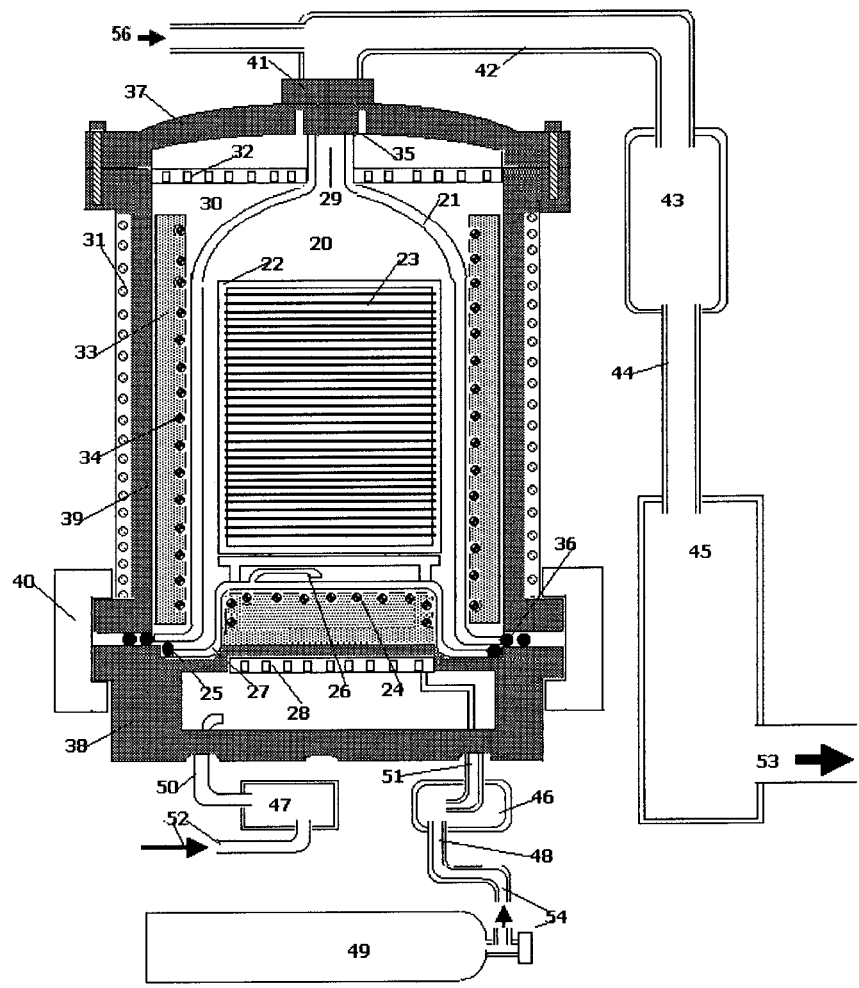
FIG. 1 shows an exemplary embodiment of a high pressure substrate annealing chamber and associated components. It uses a vertical high pressure gas chamber, and it further comprises an incoming gas delivery system and a gas exhaust/venting system.

The present invention will now be described more fully hereinafter with reference to the accompanying drawings, in which various exemplary embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Likewise, for purposes of explanation, numerous specific details are set forth in the following description in order to provide a thorough understanding of the present invention. It will be evident, however, to one skilled in the art that the present invention may be practiced without these specific details. Reference in the specification to "one embodiment" or "an embodiment" or "another embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The annealing system described above safely discards annealing gases after the annealing process is completed. However, as described above, some precious annealing gasses (e.g., deuterium) when discarded results in an expensive annealing process. The present invention aims to reclaim precious annealing gasses by providing methods, apparatuses, and systems to reclaim such precious gasses using a gas reclaiming system as described herein.

Deuterium ($D_2$) is an isotope of hydrogen, having a proton and one neutron in the nucleus of the atom. $D_2$ gas is one of many gasses that can be used in HPAP systems to process semiconductor device wafers. $D_2$ gas is typically used in annealing of semiconductor device wafers to improve performance characteristics. $D_2$ gas, especially in a high pressure annealing environment, is known to further enhance the quality of the semiconductor wafer during the annealing process.

However, $D_2$ gas is highly expensive (with costs typically 30-40 times or more than hydrogen gas). Furthermore, a typical annealing process in the HPAP system consumes only a fractional amount of the high pressure deuterium gas ambient in the process tool, with the remaining gas safely vented off (discarded) into the atmosphere.

To overcome this problem a novel integrated abatement method, apparatus, and system are described herein that will reclaim $D_2$ gas from the discarded gas mixture (comprising deuterium, trace oxygen, and moisture at parts per million (ppm) levels) from the HPAP system. The reclaimed $D_2$ can then be purified (99.9%) and safely pressurized (at pressures at or higher than 1500 pounds per square inch gauge (psig)) for reuse in the semiconductor manufacturing (e.g., HPAP annealing) process. Recovery and reuse can significantly reduce the cost of the annealing process. Further, the embodiments of any methods described herein can also be implemented on a non-transitory computer readable medium comprising instructions that can be executed by a processing system.

It should be noted that while this disclosure, using one or more embodiments, discusses the invention using deuterium as the precious annealing gas, a person of ordinary skill in the art would appreciate that any precious annealing gas (that can be used for in a annealing process) can be reclaimed (recovered) and re-used in the HPAP system.

Figure 2:
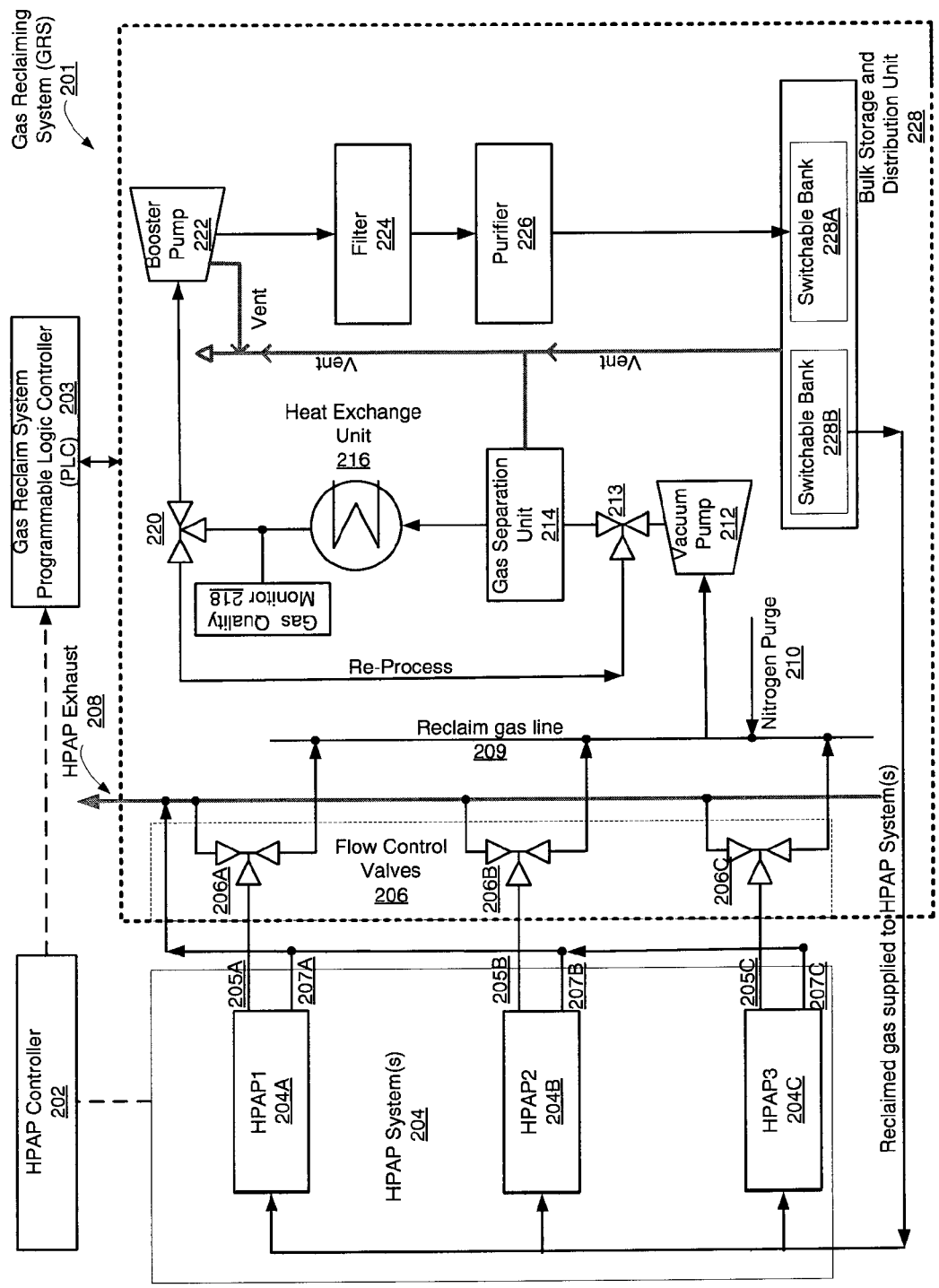
FIG. 2 shows an illustration of an exemplary gas reclaiming system in association with one or more high pressure annealing processing units in an embodiment of the present invention.

FIG. 2 describes an embodiment 200 of the Gas Reclaiming System (GRS) 201 in association with one or more HPAP systems 204. Each of the HPAP systems can be similar to one or more of the high pressure annealing systems described in U.S. Pat. No. 8,481,123 which is hereby incorporated herein by reference. As shown in FIG. 2, in one embodiment, the HPAP system 100 can be modified to work in conjunction with GRS 201, as illustrated by HPAP systems 204. Specifically, HPAP systems 204 have a modified exhaust in which the annealing gas is not mixed with the inert gas (as shown in FIG. 1). Instead the annealing gas of the inner chamber, and the inert gas from the outer chamber are released simultaneously into separate exhaust gas lines 205 and 207. Specifically, the annealing gas can be released into exhaust gas line 205 from where it can either connect with GRS 201 (using flow control valve 206) or it can be directed to an exhaust system 208 connected with the GRS 201, where the gasses can be mixed with other non-annealing gasses released from exhaust gas line 207, for safely discarding the gasses into the atmosphere. The separate exhaust lines 205 and 207 ensures that only the annealing gas used in the HPAP system 204 is processed for reclamation and that the inert gas of the outer chamber does not enter the GRS 201.

In an alternative embodiment, HPAP system 100 can be associated with GRS 201 directly (that is, without modifying the exhaust system described above). In such an embodiment, the annealing gas of the inner chamber and the inert gas from the outer chamber of HPAP system 100 are simultaneously released into a common exhaust line (instead of releasing the gases into separate exhaust gas lines 205 and 207). The gas mixture from the common exhaust line can be controlled by flow control valve 206 to either direct the gas mixture to GRS 201 or to the exhaust system 208 (from where they can be safely discarded).

Referring back to FIG. 2, in one embodiment, a HPAP system 204 can be controlled by one or more HPAP controller(s) 202. In the embodiment illustrated in FIG. 2, a HPAP controller is shown to be controlling the HPAP system(s) 204. The HPAP controller 202 can be a programmable logic controller. The HPAP system 204 is connected to the HPAP exhaust 208 via flow control valves 206. In one embodiment, the HPAP exhaust 208 is integrated within the Gas Reclaiming System 201 connected via flow control valves 206. The flow control valves 206, in one embodiment, are computer controllable and determine the flow of the annealing gas released from the HPAP system(s) 204 via exhaust gas lines 205, as shown in the figure. The flow control valves 206 can either vent off the HPAP annealing gas mixture to the atmosphere using the HPAP exhaust 208, or can flow the gas mixture to GRS 201. In one embodiment, HPAP controller 202 is associated with gas reclaim system controller 203 of the gas reclaiming system 201. In another embodiment, the gas reclaim system controller 203 is a PLC. In this embodiment, PLC 203, can control the flow control valves 206 and can direct the annealing gas mixture from the HPAP system(s) 204 to the gas reclaiming system 201 instead of the HPAP exhaust system 208. In one embodiment, gas reclaim system controller 203 (after receiving a signal from HPAP controller 202 about the release of a precious annealing gas (e.g., deuterium) from the HPAP system(s) 204 directs control valves 206 to flow the gasses towards the gas reclaiming system 201 instead of the HPAP exhaust system 208.

In one embodiment, HPAP controller 202 can be coupled to a precious annealing gas detector (not shown) of the HPAP exhaust 208. In another embodiment, the gas detector can be a part of the HPAP system(s) 204. In another embodiment, either the HPAP controller 202 or the gas reclaim system controller 203 can made aware of the annealing gas by a set of programmable instructions (based on the recipe of the gasses used to anneal the substrate wafer) being used. In yet another embodiment, a user or operator can manually instruct the HPAP controller 202 or gas reclaim system controller 203 to direct the HPAP system(s) 204 annealing gas exhaust to the GRS 201. In any case, regardless of the embodiment used, the system can made aware if a precious annealing gas is being used by any HPAP system 204. If HPAP controller 202 receives a signal (either via an instruction by a user, program, or detector) about the presence of a precious annealing gas from the gas detectors, HPAP controller 202 can transmit a signal to PLC 203. In yet another embodiment, gas reclaim system controller 203 can be automated or manually controlled to direct flow control valves 206 to the GRS 201, with or without HPAP controller 202. PLC 203, on receiving the signal indicating to reclaim the gas, can then control and instruct different aspects of the GRS 201 to perform accordingly, as described herein.

As shown in FIG. 2 HPAP system 204A is connected to GRS 201 via control valve 206A, through exhaust gas line 205A. HPAP system 204B is connected to GRS 201 via control valve 206B through exhaust gas line 205B, and HPAP system 204C is connected to GRS 201 via control valve 206C through exhaust gas line 205C. HPAP system(s) 204A, 204B, and 204C are also connected to HPAP Exhaust 208 through exhaust gas lines 207A, 207B, and 207C respectively. In this embodiment, exhaust gas lines 205A, 205B, and 205C are connected to the inner chamber of HPAP systems 204 and exhaust gas lines 207A, 207B, and 207C are connected to the outer chamber of the HPAP systems 204. Furthermore, flow control valves 206A, 206B, and 206C, are connected to HPAP exhaust 208, but can also direct the used annealing gas mixture (from exhaust gas lines 205) to GRS 201 to reclaim the gas. Each of valves 206A, 206B, and 206C can be three-way valves that allow for three possibilities: (a) closed (no flow through the valve; (b) open in one direction and (c) open in another direction.

Using HPAP system 204A as a non-limiting example the connection of the HPAP system(s) 204 to GRS 201 is described. In one embodiment, HPAP system 204A is comprised of an inner (process) and outer (containment) chamber. The outer chamber is supplied with a high pressure inert gas (e.g., nitrogen). A high pressure precious annealing gas (e.g., deuterium up to 370 psig (25 ATM)) is supplied into the inner HPAP chamber from a high pressure deuterium bulk storage and distribution unit 228. The precious annealing gas is exhausted from the inner chamber of HPAP system 204A via exhaust gas lines 205A, while the outer chamber of HPAP system 204A exhausting the inert gas simultaneously via gas line 207A.

In one embodiment, flow control valve 206A is used to convey the ambient pressure exhausted gases of the inner chamber of HPAP subsystem 204A from gas line 205A to GRS 201 when a previous annealing gas is known to be directed towards HPAP exhaust 208 via exhaust gas line 205A. The HPAP system controller 202 transmits a signal to gas reclaim system controller 203 about the presence of the precious annealing gas in exhaust gas line 205A, to begin the gas reclamation process. If however, HPAP controller 202 does not transmit the signal, the annealing gas is routed through HPAP exhaust 208. In one embodiment, HPAP exhaust 208 can be a typical house scrubber. The outer chamber of HPAP system 204A is allowed to vent the inert gas used during the annealing process via exhaust gas line 207A, in a typical manner to house scrubber exhaust 208.

As discussed above, in one embodiment, each HPAP system 204 can have its own HPAP controller 202, each HPAP controller 202 able to direct each control valve 206 independently. In one embodiment, a single HPAP controller 202 can control the flow of flow control valve 206A, flow control valve 206B, and flow control valve 206C, independently, depending on the annealing gas used in the annealing process of each HPAP system. Thus, depending on the presence of a precious annealing gas in the HPAP system(s) 204 a particular HPAP system 204 may or may not participate in the gas reclaiming process. For example, if HPAP system 204A is discarding a precious annealing gas (e.g., deuterium), and it is further known that HPAP systems 204B and 204C are discarding a non-precious annealing gas (e.g., hydrogen), then HPAP controller 202 can transmit a signal to gas reclaim system controller 203 indicating the presence of a precious annealing gas only at HPAP system 204A. In turn, gas reclaim system controller 203 can indicate to flow control valve 206A to direct the annealing gas mixture in exhaust gas line 205A towards the reclaiming process and can also indicate to flow control valve 206B and 206C to discard the gas mixture in exhaust gas lines 205 B and 205C to HPAP exhaust 208. Thus, in one embodiment, selective control of the flow control valves 206 can be implemented. Each flow control valve 206 can direct the annealing gas to be reclaimed (from their respective exhaust gas lines 205) towards reclaim gas line 209 when a precious annealing gas is to be reclaimed.

It should be noted, although FIG. 2 shows three HPAP systems (HPAP system 204A, HPAP system 204B, and HPAP system 204C), FIG. 2 represents an exemplary system describing the present invention; the invention is not limited to any specific numbers of HPAP systems. As disclosed above, gas reclaim system controller 203 of the gas reclaiming system 201, on receiving a signal from the HPAP controller can direct flow control valves 206 to flow the annealing gas mixture to either begin the reclaiming process or could direct the gas mixture to the HPAP exhaust 208. In one embodiment, prior to directing flow control valves 206 towards reclaiming the annealing gas, gas reclaim system controller 203 instructs another control valve (not shown) to purge the reclaiming gas system 201 with an inert gas (e.g., nitrogen) as shown at 210. Flow control valve 210 is connected to a nitrogen purge source and can purge GRS 201 at various points in gas reclaiming system 201 to make it safe for typical required maintenance activities. The nitrogen purge by flow control valve 210 flushes the gas reclaiming system 201 of any residual gas that may have already been in the gas reclaiming system. Other than safety concerns, this can be done to remove any traces of oxygen or moisture, or any other gas, that may have remained in the gas reclaiming system. In one embodiment, the nitrogen purge 210 can be connected to GRS 201 via reclaim gas line 209. After purging the gas reclaiming system 201 with an inert gas, gas reclaim system controller 203 can direct the precious annealing gas mixture (containing impurities, like oxygen and moisture) from flow control valve 206 into the GRS 201. In one embodiment, this can be achieved using a vacuum pump 212. It should be noted, a person of ordinary skill in the art may substitute a vacuum pump with any other known mechanism to convey the gas mixture towards the gas reclaiming system 201 components to reclaim the precious annealing gas.

As shown in FIG. 2, Vacuum pump 212 is connected with another flow control valve 213 which can control the direction of the annealing gas mixture. In one embodiment vacuum pump 212 is a dry chemical vacuum pump and is used to pump the ambient pressure exhausted gas line 207 containing deuterium gas to the appropriate working pressure for the deuterium gas separation unit 214 of the gas reclaim system 201. The dry chemical vacuum pump 212 can be configured for safe handling of deuterium gas as per industry standards. In another embodiment, a dry chemical siphon pump is used. In yet another embodiment, the pump 212 can be replaced with a gas pump that pumps an inert gas into the inner chamber of the HPAP to flush the inner chamber and thereby exhaust the annealing gas into the gas reclaiming system.

Initially, gas reclaim system controller 203 directs flow control valve to direct the annealing gas mixture to the gas separation unit 214. Gas separation unit 214 can be any unit that can separate the precious annealing gas from the gas mixture, such as a molecular sieve system, a cryogenic system, or an electrolysis system. If $D_2$ is used as an annealing gas, a $D_2$ gas separating unit can be employed. The gas separation unit 214 separates the precious annealing gas from the gas mixture comprising nitrogen and trace amounts of oxygen and water. For example, when deuterium is used as the annealing gas, depending on the method of separating the gas, the gas mixture may be heated if the gas separation unit separates the gas based on permeability of the gas. Such temperature control can be performed within the gas separation unit 214. Gas separation unit 214, in one embodiment, when configured to separate deuterium gas, comprises a heated palladium coated membrane. The heated palladium coated membrane separates the deuterium gas from the nitrogen (purge) gas along with other low level gases that might be present in exhaust line 205.

The heated palladium coated membrane is an example of a molecular sieve system that effectively filters one gas from other gases; other examples of molecular sieve systems can alternatively be used. In other embodiments, the gas separation unit can be a cryogenic system that is designed to cause all gases except the annealing gas (e.g., deuterium) to transition, in phase, to a liquid at a temperature range in which the annealing gas remains a gas. In this cryogenic system, the annealing gas can be vented from the chamber in which the other gases have been liquefied to thereby separate the annealing gas from the other gases. In yet another embodiment, the gas separation unit can be an electrolysis system that burns the annealing gas. For example, when deuterium is used as the annealing gas in an electrolysis system, deuterium ($D_2$) can be burned, in the presence of oxygen ($O_2$), to produce heavy water ($D_2O$) and then the electrolysis system can use a conventional electrolysis process to separate $D_2$ from $O_2$ and $D_2O$ to produce pure $D_2$. In some embodiments, a gas separation unit can include a combination of such systems, such as a combination of a cryogenic system and a molecular sieve system or a combination of a molecular sieve system and an electrolysis system, or a combination of a cryogenic system and an electrolysis system, etc.

From there, the deuterium gas is then directed to a heat exchange unit 216 to cool down the gas. Other gases and impurities in the annealing gas mixture are conveyed to vent by the deuterium gas separation unit 214. Alternate gas separation/purification techniques may also be utilized for deuterium gas separation unit 214. In one embodiment, heat exchange unit 216 cools the hot deuterium gas (with temperatures exceeding 200 degree Centigrade) that is delivered by the deuterium gas separation unit 214, thereby preparing the re-claimed deuterium gas for next process steps, as described herein.

The gas is then directed towards a gas quality monitor 218 which monitors the purity (percentage of the annealing gas in the gas mixture) of the gas mixture. In one embodiment, the gas quality monitor transmits data regarding the purity of the annealing gas to as reclaim system controller 203. In one embodiment, gas quality monitor 218 measures and reports the deuterium gas percentage and oxygen ppm level of the re-claimed deuterium gas to gas reclaim system controller 203. In one embodiment, an additional dry chemical booster pump maybe used in re-process loop to achieve required re-process pressures.

Gas reclaim system controller 203 can be configured to reprocess the gas, if the percentage of the annealing gas in the gas mixture is below a predetermined threshold level (that is, if other gasses, e.g., nitrogen, trace oxygen, water vapor, etc. are at a higher concentration than expected). Such reprocessing can occur by diverting the gas towards the gas separation unit 214 via flow control valves 220 and 213. In one embodiment, gas reclaim system controller 203 can be configured to determine the predetermined threshold level, either manually or programmatically. If the gas quality is not determined to be at the required level, the reclaimed gas can be reprocessed through the gas separation unit 214 via flow control valves 220 and 213 to achieve required gas quality, as described below. In another embodiment, another device connected to the gas reclaim system controller 203 can transmit a signal when the desired predetermined threshold level of the gas purity has been achieved. In yet another embodiment, the gas quality monitor 218 transmits a signal to gas reclaim system controller 203 when the predetermined threshold level of the annealing gas purity has been achieved.

In the embodiment shown in FIG. 2, if it is determined that the annealing gas purity is below a predetermined threshold the gas mixture is conveyed towards flow control valve 213 via flow control valve 220. Gas reclaim system controller 203 can control the directional flow of flow control valves 213 and 220 to re-direct the gas mixture to the gas separation unit 214 for re-processing. This process can occur in a loop until the desired gas separation is achieved. For example, in a high pressure annealing process that uses 99.9% pure deuterium, the re-processing of the gas can occur until the gas quality monitor detects a deuterium purity of at least 99.9%. If during the first processing of the annealing gas at the gas separation unit 214, a gas purity of 99.9% is not achieved, the gas is reprocessed by the gas separation unit 214. Each time the gas is processed by the gas separation unit, its quality is monitored to ensure the gas has reached the desired purity level by gas quality monitor 218. This ensures that the non-annealing gasses like nitrogen, oxygen, and any trace amounts of water are sufficiently removed from the annealing gas being reclaimed. In another embodiment, gas separation unit 214 can also connected to a vent to discard the non-annealing gases like nitrogen, oxygen and trace amounts of water.

Once the desired percentage threshold of the annealing gas mixture is achieved, gas reclaim system controller 203 can direct flow control valve 220 to convey the gas to booster pump 222 where the gas is pressurized for reuse. In one embodiment, booster pump 222 pressurizes the gas received from the heat exchange unit 216 to at least 1500 psig. In one embodiment, booster pump 222 is also connected to the vent system. The pressurized gas is then conveyed to filter 224 where any impurities in the gas are removed before diverting the gas purifier system 226 which purifies the pressurized gas removing any trace impurities that were not filtered by filter 224. In one embodiment gas purifier 226 is a ppm level gas purifier and conditions and cleans the reclaimed pressurized gas making the precious annealing gas once again usable for the HPAP system(s) 204. In one embodiment, the gas purifier 226 ensures that the annealing gas is purified to achieve a quality of 99.99% purity.

The pressurized gas is then conveyed to the bulk storage and distribution unit 228 from where the reclaimed gas can be resupplied to HPAP system(s) 204. In one embodiment, the bulk storage and distribution unit 228 consists of several ASME pressure vessels for volume storage of the reclaimed pressurized annealing gas delivered from booster pump 222. In another embodiment, the bulk storage and distribution unit 228 provides auto switching and pressure monitoring for simultaneous refilling and redistribution of the reclaimed pressurized annealing gas to the HPAP system(s) 204. In one embodiment, the reclaimed annealing gas is pressurized (prior to being conveyed to the bulk storage and distribution unit) to at least 450 psig for delivery to HPAP systems 204.

In one embodiment, the bulk storage and distribution unit 228 comprises a plurality of banks, each bank including numerous one or more vessels to store and/or distribute the reclaimed annealing gas. In one embodiment, each bank can be used for storage and/or distribution to the HPAP systems(s) 204. In another embodiment, each bank can function as a storage bank to store the reclaimed gas, and can also switch to act as a distribution bank to deliver the reclaimed gas to the HPAP system(s) 204. Such dual purpose banks are referred as switchable banks herein. As shown in FIG. 2, bulk storage and distribution unit 228 comprises two switchable banks 228A and 228B. Bank 228A stores the purified and pressurized (reclaimed) annealing gas in one or more vessels, while bank 228B is coupled to the HPAP system(s) 204 to provide the annealing gas for an annealing process. Banks 228A and 228B are switchable, that is, either bank can perform the functionality of storage or distribution, as described herein.

In one embodiment, the functionality of switchable banks 228A and 228B is controlled by PLC 203. For example, in one embodiment, PLC 203 can monitor the quantity of the available/reclaimed annealing gas at bulk storage and distribution unit 228. If switchable bank 228B, in one embodiment, is unable to meet the requirements of HPAP system(s) 204 (due to low quantity of annealing gas available in switchable bank 228B), then PLC 203 can instruct switchable bank 228A (assuming switchable bank 228A has reclaimed gas available, when switchable bank 228B is empty or near empty), to switch roles with switchable bank 228B. In one embodiment, HPAP controller 202 can transmit a signal to PLC 203 informing that insufficient amount of annealing gas was provided by GRS 201. In any case, in such a scenario, switchable bank 228A can assume the distribution of the reclaimed gas to HPAP system(s) 204, while switchable bank 228B can assume the functionality of storing the reclaimed gas received from purifier 226. In another embodiment, the storage and distribution unit 228 can autonomously (or semi-autonomously) configure the functionality of each bank, without receiving any instruction from PLC 203. In one embodiment, either PLC 203 or the storage and distribution unit 228 controls the switchable functionality of banks 228A and 228B using flow control valves (not shown).

In other embodiments, GRS 201 can reclaim the annealing gas with varying purity levels. In one embodiment, storage and distribution unit 228 can accommodate collection of the reclaimed annealing gas (e.g., deuterium gas) in gas cylinders that can be shipped to another party (e.g., gas distribution vendor). In a situation where it is determined that the reclaimed annealing gas is unsuitable for use in HPAP system(s) 204 (e.g., the gas is of inferior purity, the quantity of the reclaimed gas is not enough, etc.), the reclaimed annealing gas can be collected and shipped off to the other party (e.g., for further processing). In yet another embodiment, storage and distribution unit 228 can also accommodate new cylinders of the annealing gas (e.g., fully processed deuterium (semi grade gas)) from other parties (e.g., gas distribution vendors). In one embodiment, the new cylinder(s) received from the other party are certified cylinders, where the certification assures that the quality/purity of the annealing gas is suitable for use by HPAP system(s) 204.

Apart from the added flexibility of operation of the HPAP system(s) 204, another, optional, incentive of being able to replace the reclaimed gas cylinders can be to claim a credit (e.g., monetary credit, annealing gas quota credit, etc.) by shipping the reclaimed deuterium gas (with varying purity levels) to the other parties. Alternatively, if the purity level of the reclaimed annealing gas is suitable for use by the HPAP system(s) 204, the cylinders can also be resold to the other parties (and optionally certified).

A person of ordinary skill in the art would appreciate that any of the above stated components of FIG. 2 can be replaced with equivalents known in the filed of invention. Further, each component/unit described above can have its own controller associated with gas reclaim system controller/PLC 203 to convey the gas throughout the gas reclaiming system 201.

Figure 3:
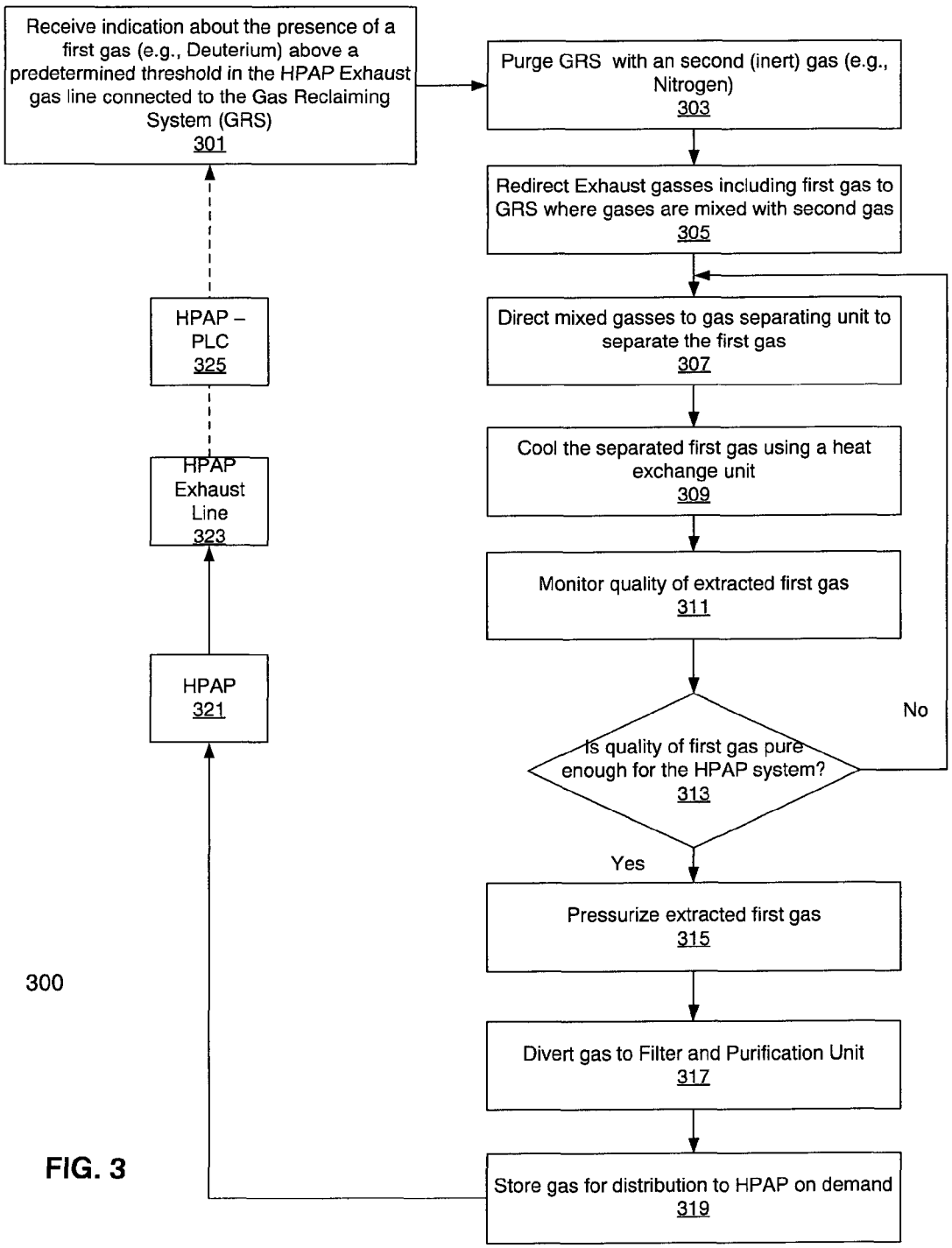
FIG. 3 is a flow chart illustrating an exemplary gas reclaiming system in association with one or more high pressure annealing processing units in an embodiment of the present invention.

FIG. 3 illustrates a flow diagram 300 describing an embodiment of the gas reclaiming system. At block 301, the gas reclaiming system receives a signal or indication about the presence of an annealing gas that has to be reclaimed in the HPAP gas exhaust line 205. As disclosed above, the HPAP controller 202 can be controlled to transmit a signal to gas reclaim system controller 203 of the gas reclaiming system 201 only when a precious annealing gas (e.g., deuterium) was just used in an annealing process or when the gas (e.g., deuterium) is detected in the exhaust. For example, if a non-precious gas like hydrogen is present in HPAP exhaust 208 or was just used in a prior process in the HPAP, then no signal is transmitted to GRS 201. In another embodiment, HPAP controller 202 only transmits the signal when the precious annealing gas is detected to be or is known to be (e.g., by values in a recipe) above a certain threshold. For example, based on the recipe used for annealing the substrate wafers, if only trace amounts of deuterium are used in the recipe, it may be not useful to reclaim the gas. In such a situation, HPAP controller 202 can be configured (for example, based on the recipe) to not transmit a signal to the gas reclaiming system 201, and the annealing gas mixture in exhaust gas line 205 can be safely purged (using nitrogen) into the atmosphere via HPAP exhaust 208 (rather than reclaiming the gas mixture). In such a case, the gasses from exhaust gas line 207 and exhaust gas line 205 would be released simultaneously, so that the gases mix in HPAP exhaust 208. In one embodiment, additional nitrogen from the nitrogen purge valve 210 can be used to ensure the gasses are discarded safely into the atmosphere.

In one embodiment, when deuterium is used, HPAP controller 202 transmits a signal to gas reclaim system controller 203 connected to GRS 201 to initiate the gas reclamation process. Upon receiving the signal, as described at block 303, GRS 201 is purged with an inert gas (e.g., nitrogen) to remove any gas residues or impurities from the system. At block 305 GRS 201 directs the annealing gas mixture (including traces of nitrogen, used during the nitrogen purge) from the reclaimed gas line 209. In another embodiment, a gas pump can be used to flush the inner chamber of the annealing gas to thereby exhaust that gas into the gas reclaiming system. At block 307, the gas mixture is directed towards the gas separating unit 214 where the annealing gas is separated from the gas mixture, and the remaining non-annealing gases are discarded. The gas separation unit 214 may have to heat (or cool) the gas, as necessary to optimally separate the annealing gas from the gas mixture. At block 309 the separated annealing gas is passed through heat exchange unit 216 where the gas is cooled down (or heated, depending on the process used to separate the annealing gas). For example, in one embodiment, a deuterium gas separating unit 214 using a gas separation process involving palladium membranes may have to maintain the temperature of the gas at a specific range required to optimally defuse the deuterium atoms through the palladium membrane. It should be noted though, each separation unit or method may have its own requirements, and thus the specific process may be dependent on the conditions required to optimally separate the precious annealing gas. As such the specific functionality or mode of operation of any specific unit/component described herein are to be considered as non-limiting examples.

At block 311, the quality of the extracted gas is monitored, for example by gas quality monitor 218. At block 313, the purity of the extracted gas is verified and if it is determined that the annealing gas is below a predetermined threshold (that is, the gas is not purified enough to be considered as suitable for an annealing process in the HPAP(s) systems 204), then the gas is re-directed to the gas separating unit 214 (block 307) to further separate the annealing gas from the non-annealing gases (e.g., nitrogen, and trace amounts of oxygen, and/or water). This process continues until the quality/purity of the annealing gas is higher than a predetermined value.

Once the desired purity of the annealing gas is achieved, the annealing gas is pressurized, at block 315. In one embodiment, the annealing gas is pressurized to at least 1500 psig by booster pump 222. At block 317, the reclaimed annealing gas is filtered and further purified (e.g., in one embodiment, by filter 224 and purifier 226 respectively), before storing it for distribution to a HPAP system (e.g., bulk storage and distribution unit 228) at block 319. At block 321, the reclaimed annealing gas is supplied to the HPAP system(s) 204. After the annealing gas is used by the HPAP system(s) 204 and the annealing process is complete, the gas is released to HPAP exhaust line 205 (block 323). At block 325, HPAP controller determines the gasses in the exhaust line 205 are to be reclaimed, and the process can start over again.

Figure 4:
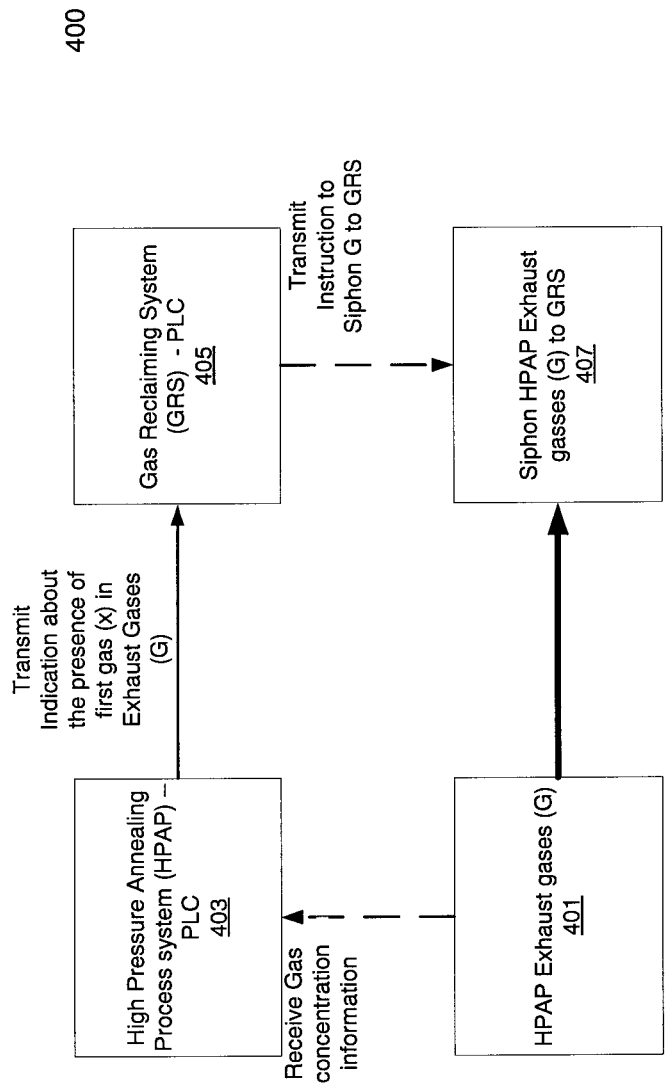
FIG. 4 is a flow diagram illustrating an exemplary process of an interaction of programmable units between the high pressure annealing process and a gas reclaiming system, as used in an embodiment of the present invention.

FIG. 4 describes a flow diagram 400 illustrating an exemplary process of an interaction of programmable units between the high pressure annealing process and a gas reclaiming system, as used in an embodiment of the present invention. Block 401 represents the gas mixture (represented by G) in the exhaust gas line 205 of a high pressure annealing processing system. The annealing gas information (represented by x) is received by a computing device associated with the high pressure annealing processing system, as represented at block 403. Once the gas concentration information is received, in one embodiment, the computing device associated with the high pressure annealing processing system can make a determination whether a signal should be transmitted to the gas reclaiming system to start reclaiming that annealing gas. In one embodiment, such a determination can be made based on a predetermined threshold. For example, when a mixture of the annealing gasses comprises only 10% deuterium, in one embodiment, the high pressure annealing processing system may be configured to not transmit the signal to the gas reclaiming system, thus not recovering the deuterium. In another embodiment, a user is given the ability to configure the system determining when the signal to initiate the gas reclaiming system should be transmitted. Once a computing device associated with the gas reclaiming system, as represented at block 405, receives the signal, the pumping device of the gas reclaiming system can be instructed to pump the exhaust gases towards the gas reclaiming system as represented at block 407.

Figure 5:
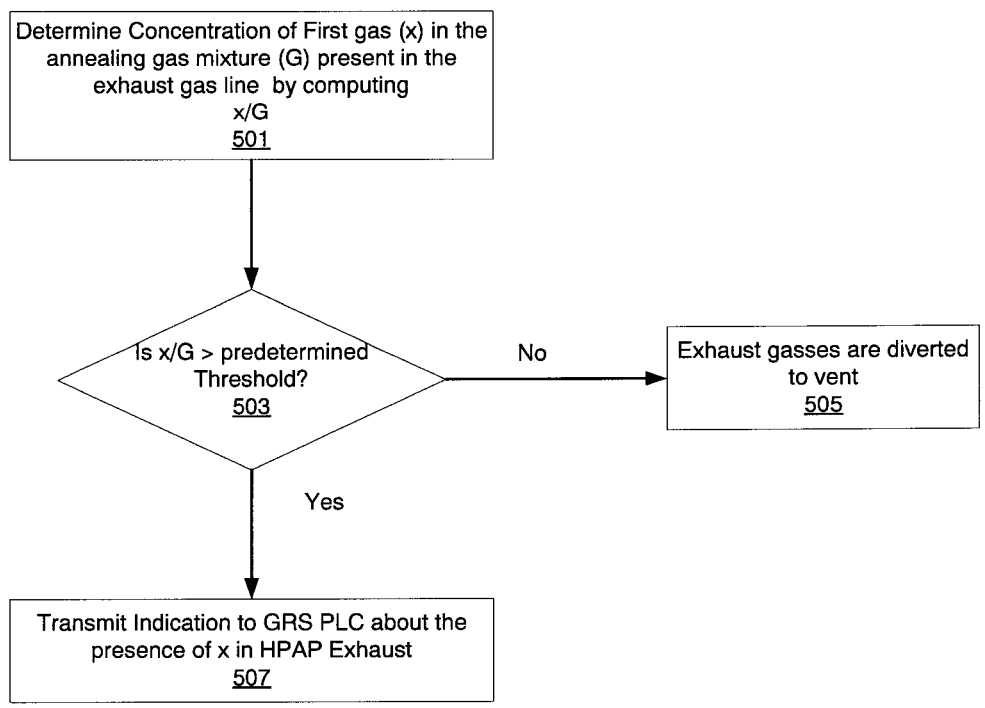
FIG. 5 is a flow chart illustrating an exemplary process of an interaction of programmable units between the high pressure annealing process and a gas reclaiming system, as used in an embodiment of the present invention.

FIG. 5 describes a flow chart 500 illustrating an exemplary process of an interaction of programmable units between the high pressure annealing process and a gas reclaiming system, as used in at least one embodiment of the present invention. In one embodiment, at block 501, the high pressure annealing processing system computes the concentration of the annealing gas (represented by x) in the gas mixture (represented by G) from the exhaust gas line 205. In one embodiment, this can be calculated as:

$$\text{concentration of annealing gas} = x/G$$

The concentration of the gasses in the exhaust gas line 205, in one embodiment, can be determined by using gas sensors. At decision block 503, HPAP controller 202 can determine if x/G is more than a predetermined threshold. In one embodiment, this threshold limit can be programmed by an operator or user of the system. This threshold can be configured differently depending on the gas being used and after performing a cost-benefit analysis of reclaiming the gas, as disclosed herein. For example, if precious annealing gasses like deuterium are only found in trace amounts in the exhaust system, it may be determined that it would be more expensive to reclaim the gas than to discard the annealing gas. Thus, depending on the threshold limits set, in one embodiment, HPAP controller 202 can be configured to discard the annealing gas as shown at block 505. If, however, no precious annealing gas is determined, then the threshold of the gas concentration (x/G) would not be met, and the annealing gas can be conveyed to the HPAP exhaust vent as shown at block 505. However, if the concentration of x/G is determined to be higher than the predetermined threshold, then HPAP controller 202 can transmit a signal to gas reclaim system controller 203 indicating the presence of a precious annealing gas in the exhaust system, as shown at block 507.

In yet another embodiment, the concentration of the precious annealing gas in exhaust gas line 205 is known based on the recipe used to anneal the substrate wafers and thus, HPAP controller 202 can be configured accordingly.

Figure 6:
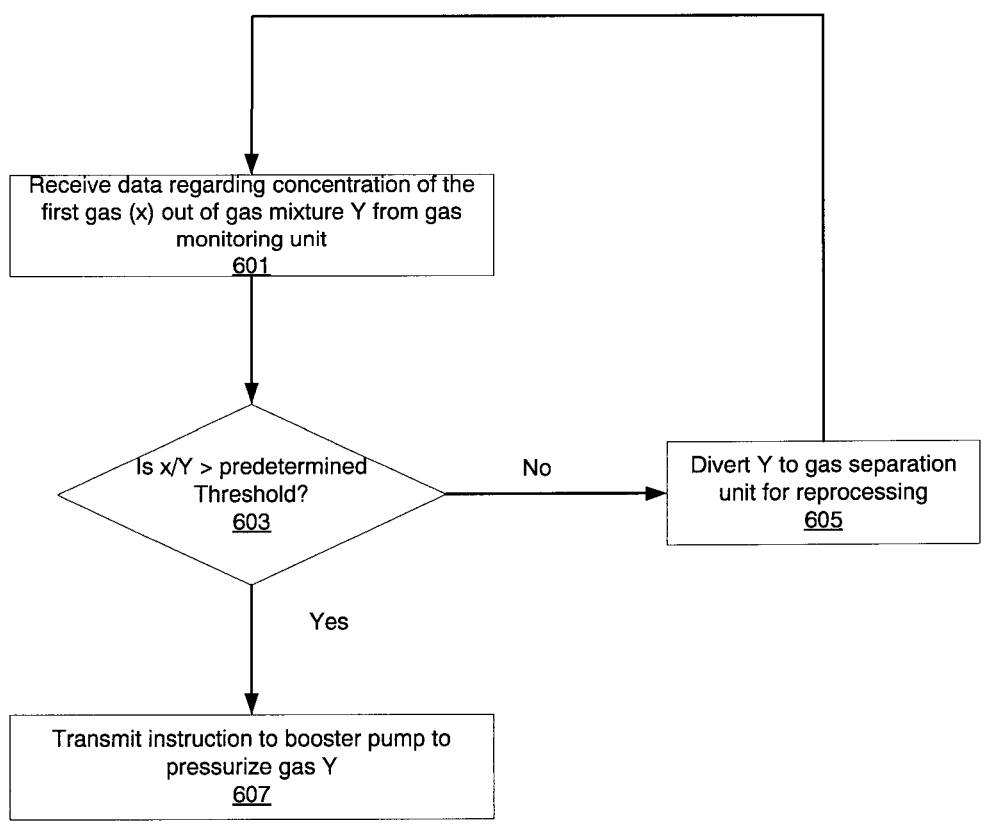
FIG. 6 is a flow chart illustrating an exemplary process used in an embodiment of the present invention of monitoring the quality of the separated precious gas.

FIG. 6 describes a flow chart 600 illustrating an exemplary process used in an embodiment of the present invention of monitoring the quality of the separated precious annealing gas. In one embodiment, gas quality monitor 218 computes data including the concentration of the annealing gas (represented by x) from the separated gas mixture (represented by Y). Although concentration Y is expected to substantially equal to the concentration of x, there can be factors (e.g., temperature of the gas in the gas separation unit 214), that may result in an inefficient separation of the annealing gas from the gas mixture. This information can be received by gas reclaim system controller 203, as shown at block 601. In one embodiment, gas reclaim system controller 203 can compute the concentration of x in the gas mixture Y, to determine the quality or purity of the separated gas. If, as shown at 603, it is determined that the concentration of x is below a predetermined threshold, gas mixture Y can be reprocessed through the gas separation unit as shown at 605. This process can be repeated until the desired purity/quality of the annealing gas is achieved. Once the desired quality of the annealing gas has been achieved, in one embodiment, gas reclaim system controller 203 can instruct the booster pump to pressurize the gas to continue the gas reclaiming process as described herein.

Figure 7:
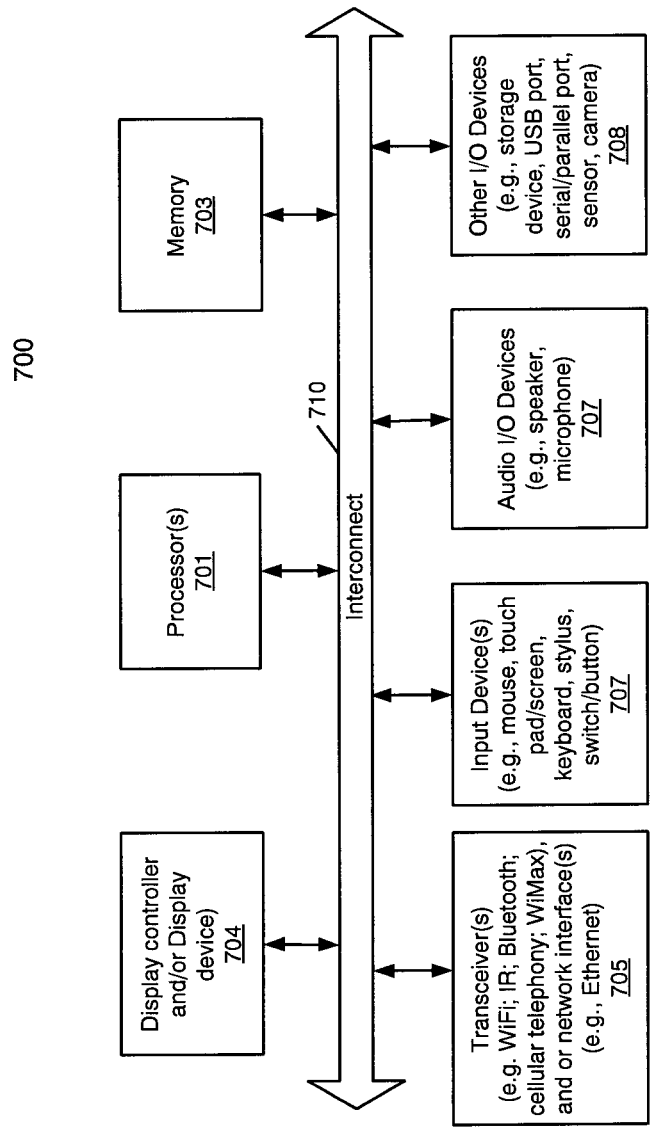
FIG. 7 illustrates an exemplary system of a programmable computing device that can, in one embodiment, automatically control the gas reclaiming system.

FIG. 7 is a block diagram illustrating a data processing system such as a computing system 700 which may be used with one embodiment of the invention. For example, system 700 may be implemented as part of a gas reclaiming system. In one embodiment, system 700 may represent the control panel of the gas reclaiming system 201. In another embodiment, system 700 can be a programmable logic controller such as PLC 203 or PLC 405 or HPAP PLC 202 or 403. In yet another embodiment, system 700 can represent any computing device that can, directly or indirectly, interact with or control the gas reclaiming system 201. In one embodiment, system 700 can interact with a controller of HPAP system(s) 204. System 700 may have a distributed architecture having dispersed units coupled through a network, or all of its components may be integrated into a single unit. Computing system 700 may be implemented as part of a diverse range of products implemented by Poongsan Corporation of Korea.

For example, computing system 700 may represents any of data processing systems described above performing any of the processes or methods described above. System 700 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 700 is intended to show a high level view of many components of the computer system. However, it is to be understood that additional or fewer components may be present in certain implementations and furthermore, different arrangement of the components shown may occur in other implementations. System 700 may represent a desktop, a laptop, a tablet, a server, a mobile phone, a programmable logic controller, a personal digital assistant (PDA), a personal communicator, a network router or hub, a wireless access point (AP) or repeater, a set-top box, or a combination thereof.

In one embodiment, system 700 includes processor 701, memory 703, and devices 705-708 via a bus or an interconnect 710. Processor 701 may represent a single processor or multiple processors with a single processor core or multiple processor cores included therein. Processor 701 may represent one or more general-purpose processors such as a microprocessor, a central processing unit (CPU), or the like. More particularly, processor 701 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 701 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 701, which may be a low power multi-core processor socket such as an ultra low voltage processor, may act as a main processing unit and central hub for communication with the various components of the system. Such processor can be implemented as a system on chip (SoC). In one embodiment, processor 701 may be an Intel® Architecture Core™-based processor such as an i3, i5, i7 or another such processor available from Intel Corporation, Santa Clara, Calif. However, other low power processors such as available from Advanced Micro Devices, Inc. (AMD) of Sunnyvale, Calif., an ARM-based design from ARM Holdings, Ltd. or a MIPS-based design from MIPS Technologies, Inc. of Sunnyvale, Calif., or their licensees or adopters may instead be present in other embodiments.

Processor 701 is configured to execute instructions for performing the operations and methods discussed herein. System 700 further includes a graphics interface that communicates with graphics subsystem 704, which may include a display controller and/or a display device.

Processor 701 may communicate with memory 703, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2 (published April 2009), or a next generation LPDDR standard to be referred to as LPDDR3 that will offer extensions to LPDDR2 to increase bandwidth. As examples, 2/4/8 gigabytes (GB) of system memory may be present and can be coupled to processor 701 via one or more memory interconnects. In various implementations the individual memory devices can be of different package types such as single die package (SDP), dual die package (DDP) or quad die package (QDP). These devices can in some embodiments be directly soldered onto a motherboard to provide a lower profile solution, while in other embodiments the devices can be configured as one or more memory modules that in turn can couple to the motherboard by a given connector.

Memory 703 can be a machine readable non-transitory storage medium such as one or more volatile storage (or memory) devices such as random access memory (RAM), dynamic RAM (DRAM), synchronous DRAM (SDRAM), static RAM (SRAM), or other types of storage devices such as hard drives and flash memory. Memory 703 may store information including sequences of executable program instructions that are executed by processor 701, or any other device. For example, executable code and/or data of a variety of operating systems, device drivers, firmware (e.g., input output basic system or BIOS), and/or applications can be loaded in memory 703 and executed by processor 701. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 700 may further include IO devices such as devices 705-708, including wireless transceiver(s) 705, input device(s) 706, audio IO device(s) 707, and other IO devices 708. Wireless transceiver 705 may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, network interfaces (e.g., Ethernet interfaces) or a combination thereof.

Input device(s) 706 may include a mouse, a touch pad, a touch sensitive screen (which may be integrated with display device 704), a pointer device such as a stylus, and/or a keyboard (e.g., physical keyboard or a virtual keyboard displayed as part of a touch sensitive screen). For example, input device 706 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

Audio IO device 707 may include a speaker and/or a microphone to facilitate voice-enabled functions, such as voice recognition, voice replication, digital recording, and/or telephony functions. Other optional devices 708 may include a storage device (e.g., a hard drive, a flash memory device), universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. Optional devices 708 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 710 via a sensor hub (not shown), while other devices such as a keyboard or thermal sensor may be controlled by an embedded controller (not shown), dependent upon the specific configuration or design of system 700.

To provide for persistent storage of information such as data, applications, one or more operating systems and so forth, a mass storage (not shown) may also couple to processor 701. In various embodiments, to enable a thinner and lighter system design as well as to improve system responsiveness, this mass storage may be implemented via a solid state device (SSD). However in other embodiments, the mass storage may primarily be implemented using a hard disk drive (HDD) with a smaller amount of SSD storage to act as a SSD cache to enable non-volatile storage of context state and other such information during power down events so that a fast power up can occur on RE-initiation of system activities. Also a flash device may be coupled to processor 701, e.g., via a serial peripheral interface (SPI). This flash device may provide for non-volatile storage of system software, including a basic input/output software (BIOS) as well as other firmware of the system.

Note that while system 700 is illustrated with various components of a data processing system, it is not intended to represent any particular architecture or manner of interconnecting the components; as such details are not germane to embodiments of the present invention. It will also be appreciated that network computers, handheld computers, mobile phones, and other data processing systems which have fewer components or perhaps more components may also be used with embodiments of the invention.

Thus, methods, apparatuses, and computer readable medium to reclaim the gas used in semiconductor devices in a high pressure gas environment have been provided. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A semiconductor wafer processing system comprising:
   a high pressure annealing system having an inner chamber configured to hold wafers and either an annealing gas or another gas in the inner chamber, and having an outer chamber which surrounds the inner chamber and which is configured to hold an inert gas while the inner chamber holds either the annealing gas or the another gas;
   a gas reclaiming system;
   a valve switchably coupling the inner chamber to either an atmospheric exhaust or to the gas reclaiming system;
   a data processing system coupled to the valve to control the valve to switch the valve between atmospheric exhausting when the another gas was used in the inner chamber and reclaiming when the annealing gas was used in the inner chamber;
   wherein the gas reclaiming system further comprises:
      a gas capture system to retrieve the annealing gas from the inner chamber, the gas capturing system switchably coupled to the inner chamber though the valve;
      a gas separation unit coupled to the gas capture system, the gas separation unit configured to separate the annealing gas from a purge gas;
      a purge gas source coupled to the gas separation unit and configured to supply the purge gas into the gas separation unit;
      a gas purifier coupled to a heat exchanger, the gas purifier including one or more filters;
      a bank of one or more storage vessels coupled to the gas purifier to store purified annealing gas.

2. The semiconductor wafer processing system of claim 1, wherein the gas capture system is (a) a low pressure gas capture system which uses a vacuum pump to withdraw the annealing gas from the inner chamber or (b) a gas pump to pump a flushing gas into the inner chamber to flush the annealing gas out of the inner chamber.

3. The semiconductor wafer processing system of claim 1, wherein the purge gas source comprises a gas pump.

4. The semiconductor wafer processing system of claim 1, further comprising:
   the heat exchanger coupled to the gas separation unit, the heat exchanger configured to cool the annealing gas that is output from the gas separation unit.

5. The semiconductor wafer processing system of claim 1, wherein the gas separation unit separates the annealing gas using a molecular sieve system.

6. The semiconductor wafer processing system of claim 1, wherein the gas separation unit separates the annealing gas using a cryogenic process system.

7. The semiconductor wafer processing system of claim 1, wherein the gas separation unit separates the annealing gas using an electrolysis process system.

* * * * *